(12) United States Patent
Chen et al.

(10) Patent No.: US 11,003,082 B2
(45) Date of Patent: May 11, 2021

(54) METHOD FOR FORMING SEMICONDUCTOR STRUCTURE

(71) Applicant: Taiwan Semiconductor Manufacturing Co., Ltd., Hsinchu (TW)

(72) Inventors: Chien-Chih Chen, Taipei (TW); Yahru Cheng, Taipei (TW); Ching-Yu Chang, Yuansun village (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 210 days.

(21) Appl. No.: 16/027,680

(22) Filed: Jul. 5, 2018

(65) Prior Publication Data

US 2019/0043710 A1  Feb. 7, 2019

Related U.S. Application Data

(60) Provisional application No. 62/539,704, filed on Aug. 1, 2017.

(51) Int. Cl.
*G03F 7/38* (2006.01)
*H01L 21/027* (2006.01)
(Continued)

(52) U.S. Cl.
CPC .............. *G03F 7/38* (2013.01); *G03F 7/0046* (2013.01); *G03F 7/038* (2013.01); *G03F 7/039* (2013.01); *G03F 7/0397* (2013.01); *G03F 7/095* (2013.01); *G03F 7/162* (2013.01); *G03F 7/2004* (2013.01); *G03F 7/322* (2013.01); *H01L 21/0274* (2013.01); *H01L 21/266* (2013.01); *H01L 21/26513* (2013.01); *H01L 21/3081* (2013.01); *H01L 21/3086* (2013.01); *H01L 21/30604* (2013.01); *H01L 21/31133* (2013.01); *H01L 21/31144* (2013.01); *H01L 21/31155* (2013.01);
(Continued)

(58) Field of Classification Search
CPC .................................................... G03F 7/2002
See application file for complete search history.

(56) References Cited

U.S. PATENT DOCUMENTS 8,764,995 B2  7/2014  Chang et al.
8,796,666 B1  8/2014  Huang et al.
(Continued)

*Primary Examiner* — Kathleen Duda
(74) *Attorney, Agent, or Firm* — Birch, Stewart, Kolasch & Birch, LLP

(57) ABSTRACT

A method for forming a semiconductor device structure is provided. The method includes forming a material layer over a substrate and providing a resist solution. The resist solution includes a plurality of first polymers and a plurality of second polymers, each of the first polymers includes a first polymer backbone, and a first acid-labile group (ALG) with a first activation energy bonded to the first polymer backbone. Each of the second polymers includes a second polymer backbone, and a second acid-labile group with a second activation energy bonded to the second polymer backbone, the second activation energy is greater than the first activation energy. The method includes forming a resist layer over the material layer, and the resist layer includes a top portion and a bottom portion, and the first polymers diffuse to the bottom portion, and the second polymers diffuse to the top portion.

20 Claims, 12 Drawing Sheets

(51) Int. Cl.
*G03F 7/004* (2006.01)
*H01L 21/311* (2006.01)
*H01L 21/306* (2006.01)
*H01L 21/266* (2006.01)
*H01L 21/308* (2006.01)
*H01L 21/8234* (2006.01)
*H01L 21/3213* (2006.01)
*H01L 21/3215* (2006.01)
*H01L 21/3115* (2006.01)
*H01L 21/265* (2006.01)
*G03F 7/16* (2006.01)
*G03F 7/32* (2006.01)
*G03F 7/20* (2006.01)
*G03F 7/038* (2006.01)
*G03F 7/039* (2006.01)
*G03F 7/095* (2006.01)
*G03F 7/09* (2006.01)
*G03F 7/075* (2006.01)
*H01L 29/66* (2006.01)

(52) U.S. Cl.
CPC .. *H01L 21/32139* (2013.01); *H01L 21/32155* (2013.01); *H01L 21/823431* (2013.01); *G03F 7/0752* (2013.01); *G03F 7/091* (2013.01); *G03F 7/094* (2013.01); *H01L 29/66795* (2013.01)

(56) References Cited

U.S. PATENT DOCUMENTS

| | | |
|---|---|---|
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2014/0272709 A1* | 9/2014 | Liu .............. G03F 7/092 430/272.1 |

\* cited by examiner

METHOD FOR FORMING SEMICONDUCTOR STRUCTURE

CROSS REFERENCE TO RELATED APPLICATIONS

This Application claims the benefit of U.S. Provisional Application No. 62/539,704 filed on Aug. 1, 2017, and entitled "Novel photoresist bilayer approach for etch process improvement", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
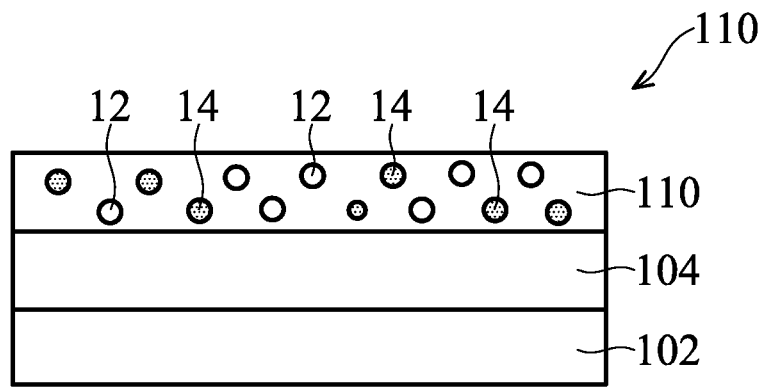
FIGS. 1A-1E show cross-sectional representations of various stages of forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Embodiments for a semiconductor structure and method for forming the same are provided. FIGS. 1A-1E show cross-sectional representations of various stages of forming a semiconductor structure, in accordance with some embodiments of the disclosure. The method can be used in many applications, such as fin-type field effect transistor (FinFET) device structure.

Referring to FIG. 1A, a substrate 102 is provided. The substrate 102 may be made of silicon or other semiconductor materials. In some embodiments, the substrate 102 is a wafer. Alternatively or additionally, the substrate 102 may include other elementary semiconductor materials such as germanium (Ge). In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Some device elements may be formed over the substrate 102. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

The substrate 102 may include various doped regions such as p-type wells or n-type wells). Doped regions may be doped with p-type dopants, such as boron or $BF_2$, and/or n-type dopants, such as phosphorus (P) or arsenic (As). In some other embodiments, the doped regions may be formed directly on the substrate 102.

The substrate 102 also includes isolation structures (not shown). The isolation structure is used to define and electrically isolate various devices formed in and/or over the substrate 102. In some embodiments, the isolation structure includes shallow trench isolation (STI) structure, local oxidation of silicon (LOCOS) structure, or another applicable isolation structure. In some embodiments, the isolation structure includes silicon oxide, silicon nitride, silicon oxynitride, fluoride-doped silicate glass (FSG), or another suitable material.

Afterwards, a material layer 104 is formed over the substrate 102, in accordance with some embodiments of the disclosure. In some embodiments, the material layer 104 is formed by a deposition process, such as a spin-on coating process, chemical vapor deposition process (CVD), physical vapor deposition (PVD) process, and/or other suitable deposition processes.

Next, a resist solution is prepared. The resist solution includes a number of first polymers 12, a number of second polymers 14 and a solvent. The first polymers 12 are different from the second polymers 14. In some embodiments, a weight ratio of the sum of the first polymer and the second polymer to the resist solution is in a range from about 2% to about 8%. In some embodiments, a weight ratio of the first polymers 12 to the sum of the first polymer and the second polymer is in a range from about 50% to about 95%. In some embodiments, a weight ratio of the second polymers 14 to the sum of the first polymer and the second polymer is in a range from about 5% to about 50%. Each of the first polymers 12 has a first average molecular weight, and each of the second polymers 14 has a second average molecular weight. In some embodiments, the second average molecular weight of each of the second polymers 14 is greater than the first average molecular weight of each of the first polymers 12.

In some embodiments, the solvent includes an organic solvent, including dimethyl sulfoxide (DMSO), tetrahydrofuran (THF), propylene glycol methyl ether (PGME), propylene glycol methyl ether acetate (PGMEA), n-Butyl acetate, Cyclohexanol, γ-Butyrolactone (GBL), ethanol, propanol, butynol, methanol, ethylene, glycol, gamabutylactone, N-Methyl-2-pyrrolidone (NMP), Diacetone alcohol (DAA), alkylsulfoxide, carboxylic ester, carboxylic acid, alcohol, glycol, aldehyde, ketone, acid anhydride, lactone, halogenated alkane, non-halogenated alkane, branched alkane, non-branched alkane, cyclic alkane, non-cyclic alkane, saturated alkane, non-saturated alkane, or a combination thereof.

Figure 2A:
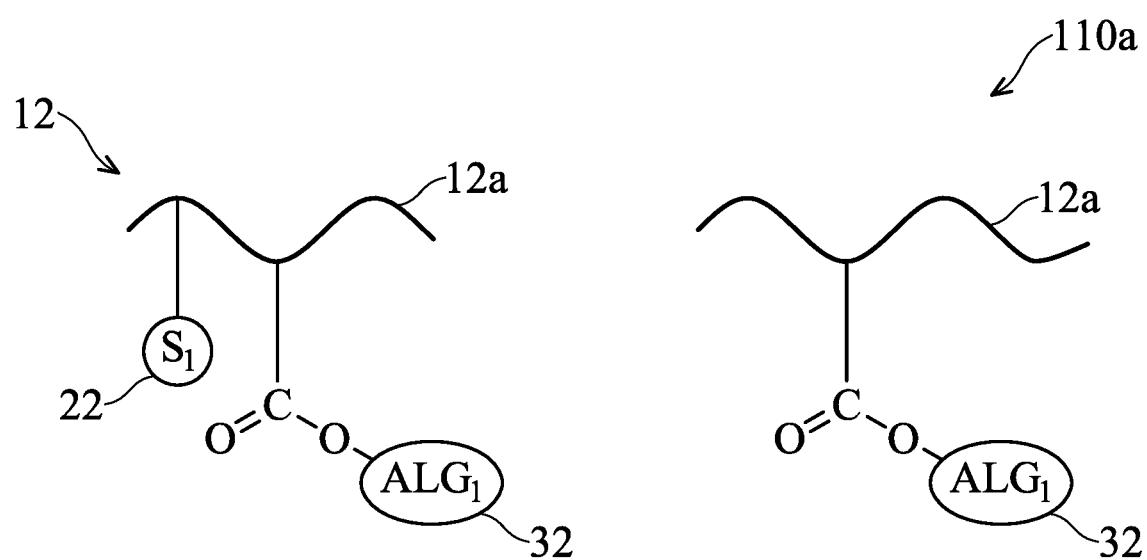
FIG. 2A shows a diagrammatical view of the chemical structures of the first polymers, in accordance with some embodiments.

FIG. 2A shows a diagrammatical view of the chemical structures of the first polymers 12, in accordance with some embodiments. Each of the first polymers 12 includes a first polymer backbone 12a, a first sensitizer group ($S_1$) 22, and a first acid labile group ($ALG_1$) 32 bonded to the first polymer backbone 12a.

In some embodiments, the first acid labile group ($ALG_1$) 32 includes aliphatic or aromatic hydrocarbon compound. In some embodiments, the first acid labile group ($ALG_1$) 32 includes esters, amides, imines, acetals, ketals, anhydrides.

In some embodiments, the first acid labile group ($ALG_1$) 32 includes t-butyl, methyl adamantyl, methyl cyclopentyl, methyl cyclohexyl, ethyl cyclopentyl, ethyl cyclohexyl, isopropyl cyclopentyl, isopropyl cyclohexyl, tert-butoxycarbonyl, iso-norbornyl, 2-methyl-2-adamantyl, 2-ethyl-2-adamantyl, 3-methyl tetrahydrofuran, 2-methyl tetrahydrofuran, lactone, 2-methyl tetrahydropyran (THP) or another applicable group.

In some other embodiments, a portion of the first polymers 12 further includes a first sensitizer group ($S_1$) 22 bonded to the first polymer backbone 12a. The first sensitizer group ($S_1$) 22 may absorb the EUV light and release secondary electrons, which then react with the photoacid generator (PAG) to generate acid. Therefore, the first sensitizer group ($S_1$) 22 is used to improve the sensitivity of the resist layer 110. In some embodiments, the first sensitizer group ($S_1$) 22 includes polyhydroxystyrene (PHS) group. In some other embodiments, the first sensitizer group ($S_1$) 22 includes a metal, a metal oxide, a metal complex, aromatic carbon ring derivatives or heterocyclic derivatives.

In addition, some function groups may be bonded to the first polymer backbone 12a. These function groups are configured to be as a protection group which is used to adjust the polarity, the etching resistance, or glass transition temperature (Tg) of the resist layer 110.

Figure 2B:
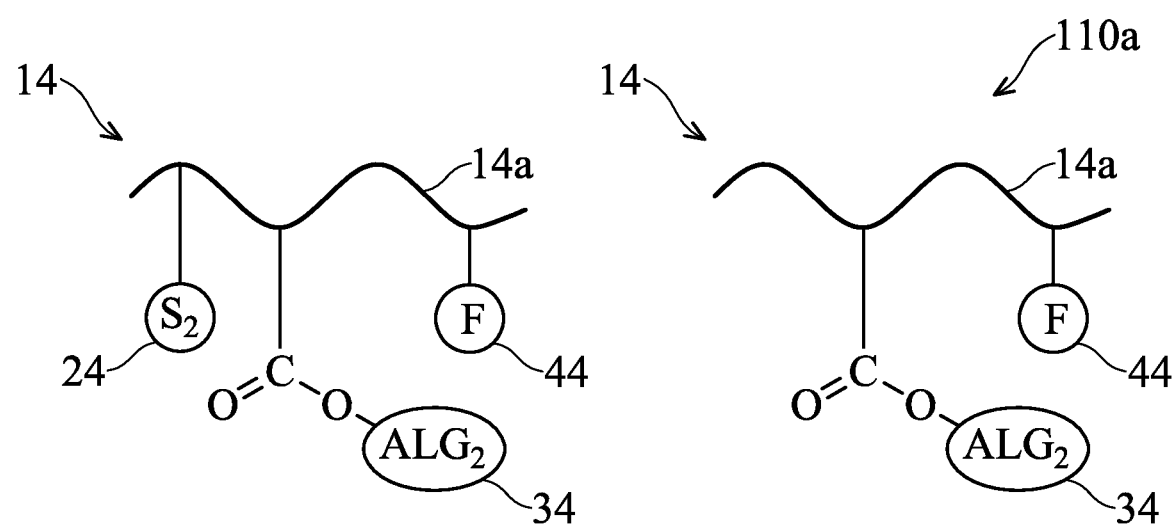
FIG. 2B shows a diagrammatical view of the chemical structures of the second polymers, in accordance with some embodiments.

FIG. 2B shows a diagrammatical view of the chemical structures of the second polymers 14, in accordance with some embodiments. Each of the second polymers 14 includes a second polymer backbone 14a, a second acid labile group ($ALG_2$) 34, and a floating group (F) 44. The second acid labile group ($ALG_1$) 34, and the floating group (F) 44 are bonded to the second polymer backbone 14a. It should be noted that the floating group (F) 44 is configured to provide the "floating" properties, and therefore the second polymer 14 float to the upper surface of the resist layer 110. This "floating" may occur automatically due to the composition of the resist materials in the resist layer 110. For example, the floating group (F) 44 includes carbon fluoride, and the fluorine (F) may cause the second polymer 14 to "float".

The second acid labile group ($ALG_2$) 34 has a second activation energy (Ea). The second activation energy (Ea) is greater than the first activation energy (Ea). The second acid labile group ($ALG_2$) 34 with a higher Ea means that more energy is needed to start the deprotection reaction. The deprotection reaction means that the acid labile group is cleaved from the polymer backbone when in the acidic environment. The first acid labile group ($ALG_1$) 32 is easier to be deprotected than the second acid labile group ($ALG_2$) 34 due to the first acid labile group ($ALG_1$) 32 having a relatively low activation energy (Ea).

Table 1 shows the activation energy (Ea) of the various acid labile groups (ALG), in accordance with some embodiments.

TABLE 1

| Ea | high Ea ←—————————————————————————→ low Ea | | | | | |
|---|---|---|---|---|---|---|
| ALG unit | t-butyl | Methyl admantyl | Methyl cyclohexyl | Ethyl cyclohexyl | Isopropyl cyclohexyl | Ethyl tetracyclododecanyl |
| name | t-butyl | Methyl admantyl | Methyl cyclohexyl | Ethyl cyclohexyl | Isopropyl cyclohexyl | Ethyl tetracyclododecanyl |

In some embodiments, the second acid labile group (ALG$_2$) 34 includes aliphatic or aromatic hydrocarbon compound. In some embodiments, the second acid labile group (ALG$_2$) 34 includes esters, amides, imines, acetals, ketals, anhydrides. In some embodiments, the second acid labile group (ALG$_2$) 34 includes t-butyl, methyl adamantyl, methyl cyclopentyl, methyl cyclohexyl, ethyl cyclopentyl, ethyl cyclohexyl, isopropyl cyclopentyl, isopropyl cyclohexyl, tert-butoxycarbonyl, iso-norbornyl, 2-methyl-2-adamantyl, 2-ethyl-2-adamantyl, 3-methyl tetrahydrofuran, 2-methyl tetrahydrofuran, lactone, 2-methyl tetrahydropyran (THP) or another applicable group.

In some embodiments, the floating group (F) 44 includes carbon fluoride (CxFy, where x is between 1 and 9 and y is between 3 and 19) including substituted or unsubstituted linear, branched aliphatic hydrocarbon group comprising 1 to 9 carbon atoms. In some embodiments, the floating group (F) 44 includes formula (VII), (VIII), (IX), (X), (XI) or (XII).

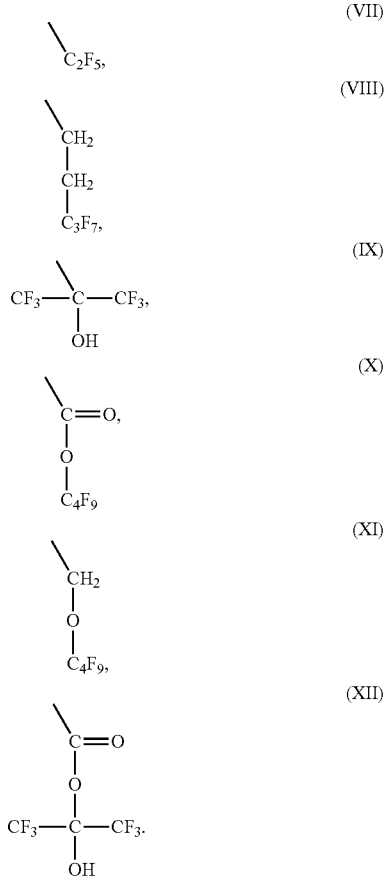

In some embodiments, a portion of the second polymers 14 further includes a second sensitizer group (S$_2$) 24 bonded to the second polymer backbone 14a. In some embodiments, the second sensitizer group (S$_2$) 24 includes polyhydroxystyrene (PHS) group. In some other embodiments, the second sensitizer group (S$_2$) 24 includes a metal, a metal oxide, a metal complex, aromatic carbon ring derivative or heterocyclic derivative.

Figure 2C:
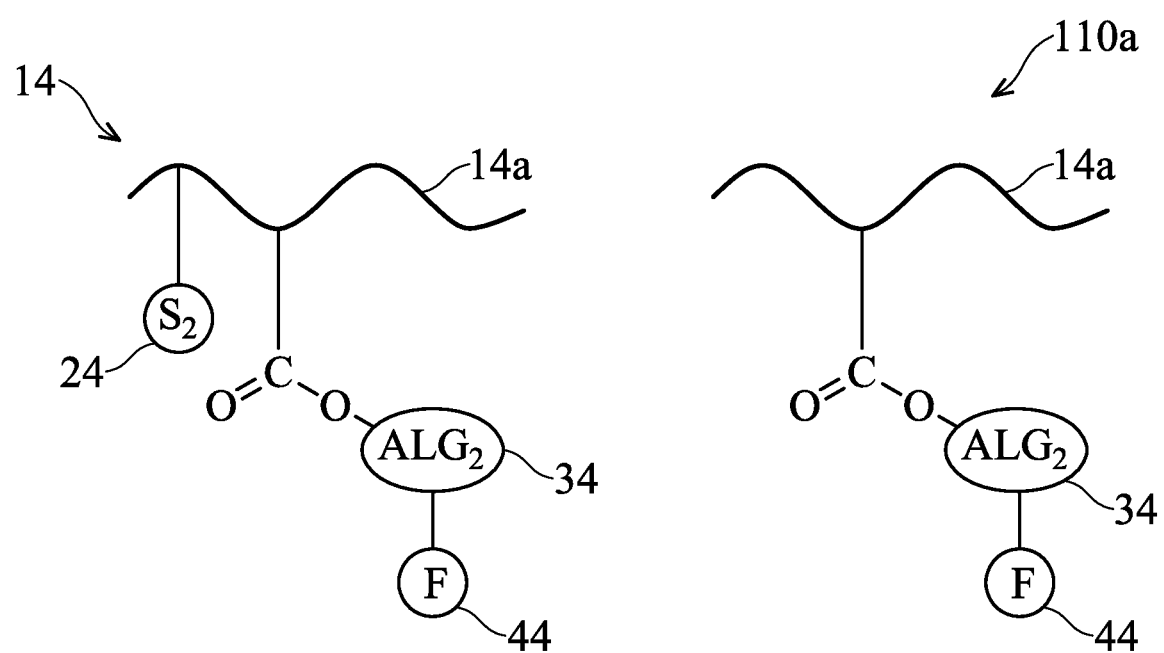
FIG. 2C shows a diagrammatical view of the chemical structure of the second polymers, in accordance with some embodiments.

FIG. 2C shows a diagrammatical view of the chemical structure of the second polymers 14, in accordance with some embodiments. The chemical structures of the second polymers 14 in FIG. 2C is similar to that of second polymers 14 in FIG. 2B, where the difference is that the floating group (F) 44 is directly bonded to the second acid labile group (ALG$_2$) 34 in FIG. 2C, rather than bonding to the second polymer backbone 14a. By the help of the location of the floating group (F) 44 in FIG. 2C, the second polymers 14 float to the upper surface of the resist layer 110 by the help of the floating group (F) 44. Therefore, the second polymers 14 are concentrated in the top portion 110b of the resist layer 110.

In addition, the resist solution may further include a photoacid generator (PAG). The PAG generates acid when the resist layer 110 is exposed to the radiation energy and absorbs the radiation. In some embodiments, the PAG includes a phenyl ring. In some embodiments, the PAG includes halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, or another applicable material.

In some embodiments, the resist solution further includes a quencher (Q). The quencher (Q) is a base type and is capable of neutralizing acid. The quencher may inhibit other active component of the resist layer 110, such as inhibiting the acid diffusion generated from PAG In some embodiments, the quencher includes a nitrogen atom having an unpaired electron capable of neutralizing an acid.

In some embodiments, the quencher (Q) includes formula (I), (II), (III), (IV) or (V).

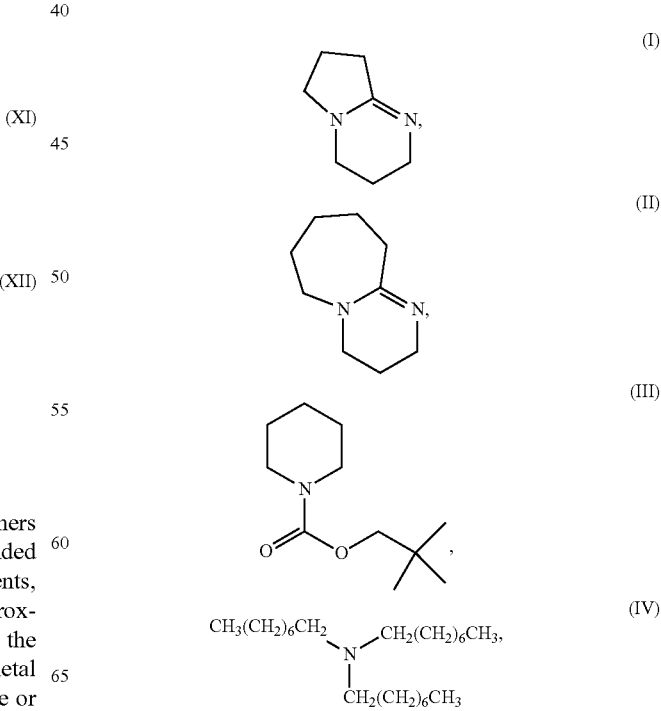

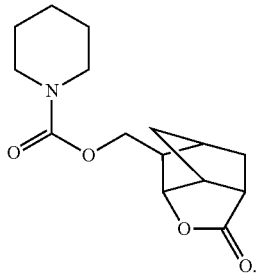

(V)

In some other embodiments, the resist solution further includes a photo-decompose base (PDB) or other suitable photosensitive components. In the exposed region, the photo decomposable base (PDB) is a base which will be decomposed when it is exposed to light. In some embodiments, the photo decomposable base (PDB) includes formula (VI), and $R^1$ represents an alicyclic group of 5 or more carbon atoms which may have a substituent; X represents a divalent linking group; Y represents a linear, branched or cyclic alkylene group or an arylene group; $R_f$ represents a hydrocarbon group containing a fluorine atom; and M+ represents an organic cation or a metal cation.

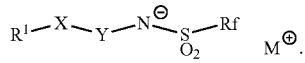

(VI)

Afterwards, the resist solution is coated on the material layer 104 using a coating process to form a resist layer 110 over the material layer 104. In some embodiments, the resist solution is coated on the material layer 104 by performing a spin-coating process. As a result, the resist layer 110 includes the first polymers 11, the second polymers 12 and the solvent. In addition, the resist layer 110 optionally includes PAG, quencher or PDB.

Figure 1B:
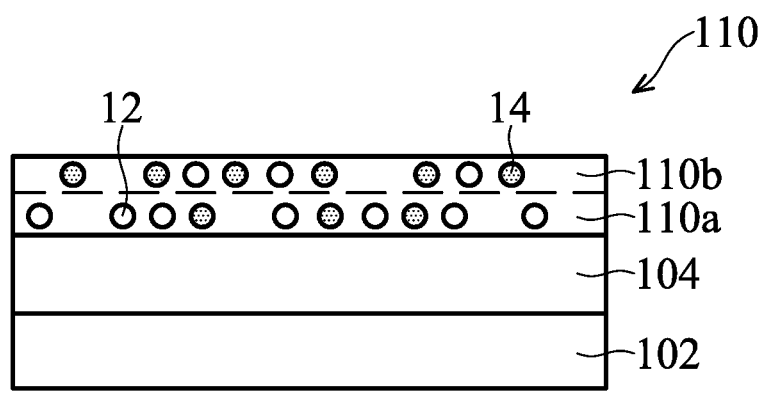

Next, as shown in FIG. 1B, after the coating process, the resist layer 110 includes a bottom portion 110a and a top portion 110b, in accordance with some embodiments of the disclosure. The dot line shown in FIG. 1B is drawn to provide a better understanding of the structure, but there is no actual interface or boundary between the bottom portion 110a and the top portion 110b.

It should be noted that the second polymers 14 diffuse to the top portion 110b of the resist layer 110 due to the floating group (F) 44. During the coating process, the second polymers 14 and the first polymers 12 diffuse in different directions. This phenomenon is called phase separation. Therefore, the resist layer 110 includes a bottom portion 110a and a top portion 110b. Most of the second polymers 14 are in the top portion 110b, and most of the first polymers 12 are in the bottom portion 110a of the resist layer 110. The first polymers 12 are distributed in the bottom portion 110a of the resist layer 110 at a first concentration and in the top portion 110b of the resist layer 110 at a second concentration, and the first concentration is higher than the second concentration. The second polymers 14 are distributed in the bottom portion 110b of the resist layer 110 at a third concentration and in the top portion 110a of the resist layer 110 at a fourth concentration, and the third concentration is lower than the fourth concentration.

In some embodiments, the resist layer 110 includes a chemically amplified resist (CAR) material. The CAR material is used to improve sensitivity of the resist layer 110. The CAR materials can generate multiple chemical reactions upon exposure to radiation, thereby chemically amplifying a response to the radiation.

In some embodiments, the resist layer 110 further includes a photoacid generator (PAG). The PAG in the resist layer 110 generates acid when the resist layer 110 is exposed to the radiation energy and absorbs the radiation.

When the resist layer 110 is exposed to radiation, the PAG catalyzes cleaving of ALG from the first polymer 12 and the second polymer 14. Thus, the first acid labile groups ($ALG_1$) 32 cleave from the first polymers 12 when the resist layer 110 is in the acidic environment. It should be noted that the first acid labile group ($ALG_1$) 32 of the first polymer 12 has a first activation energy (Ea). The activation energy (Ea) is defined as the minimum energy required to start a chemical reaction. The protected first acid labile groups ($ALG_1$) 32 undergo the hydrolysis reaction under the acidic environment. Therefore, the protected acid labile group (ALG) is deprotected or cleaved from the polymer backbone by a deprotection reaction. After the ALG is cleaved from the polymer backbone, the carboxylic acid group is formed in the polymer. Therefore, the polarity and/or solubility of the exposed region of the resist layer 110 are changed.

Figure 3A:
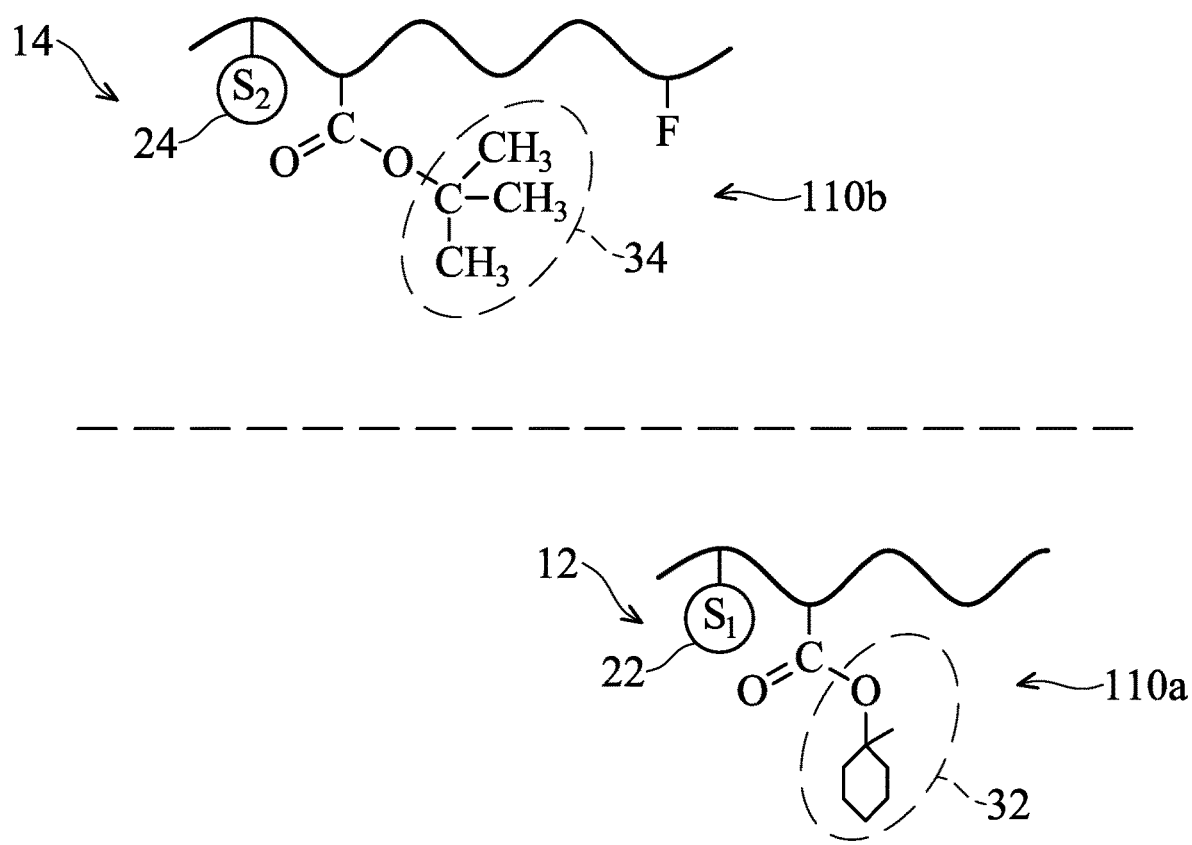
FIGS. 3A-3C show diagrammatical views of the chemical structures of the first polymers and the second polymers, in accordance with some embodiments.
Figure 3B:
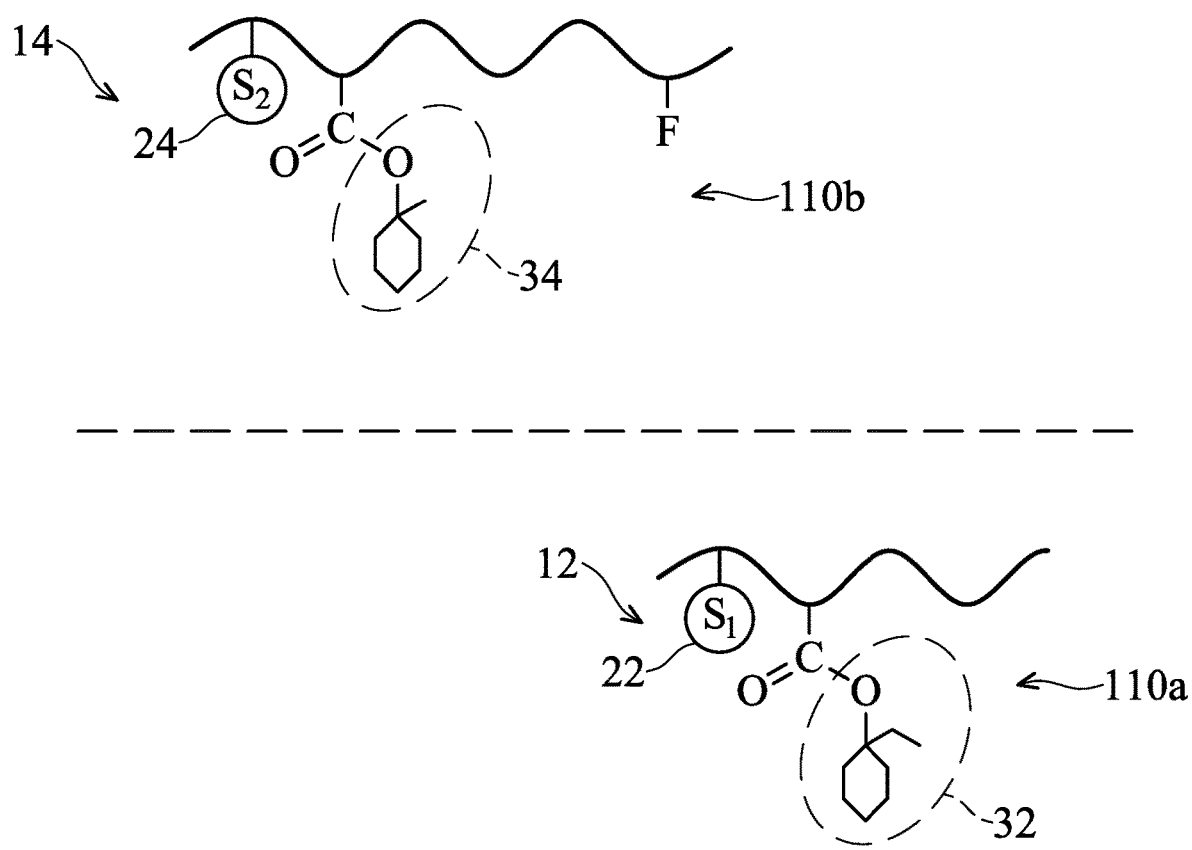
Figure 3C:
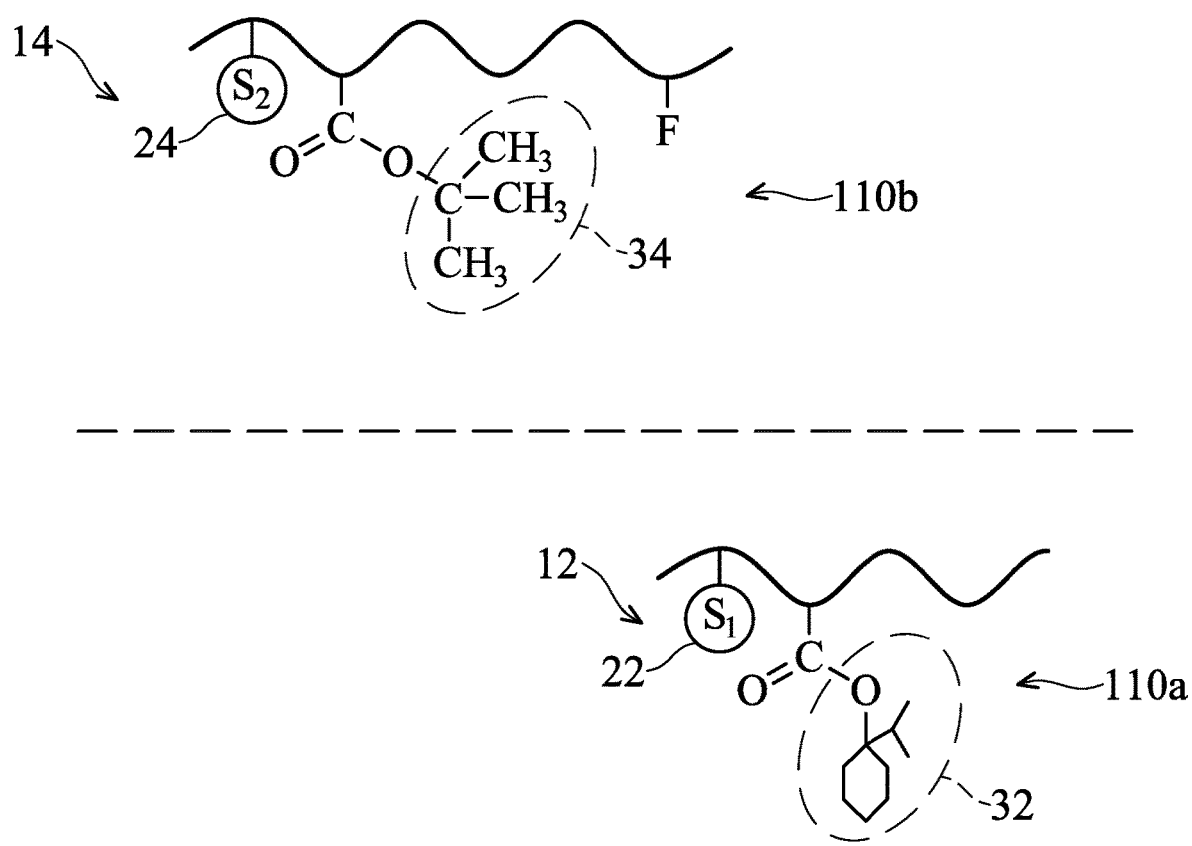

FIGS. 3A-3C show diagrammatical views of the chemical structures of the first polymers 12 and the second polymers 14, in accordance with some embodiments. The first polymers 12 diffuse to the bottom portion 110a of the resist layer 110. In some embodiments, the first acid labile group ($ALG_1$) 32 in the first polymers 12 is the methyl cyclohexyl group. The second polymers 14 diffuse to the top portion 110b of the resist layer 110. In some embodiments, the second acid labile group ($ALG_1$) 34 in the second polymers 14 is the t-butyl group.

As shown in FIG. 3B, in some embodiments, the first acid labile group ($ALG_1$) 32 in the first polymers 12 is the ethyl cyclohexyl group. In some embodiments, the second acid labile group ($ALG_1$) 34 in the second polymers 14 is methyl cyclohexyl group.

As shown in FIG. 3C, in some embodiments, the first acid labile group ($ALG_1$) 32 in the first polymers 12 is the isopropyl cyclohexyl group. In some embodiments, the second acid labile group ($ALG_1$) 34 in the second polymers 14 is t-butyl group.

Figure 1C:
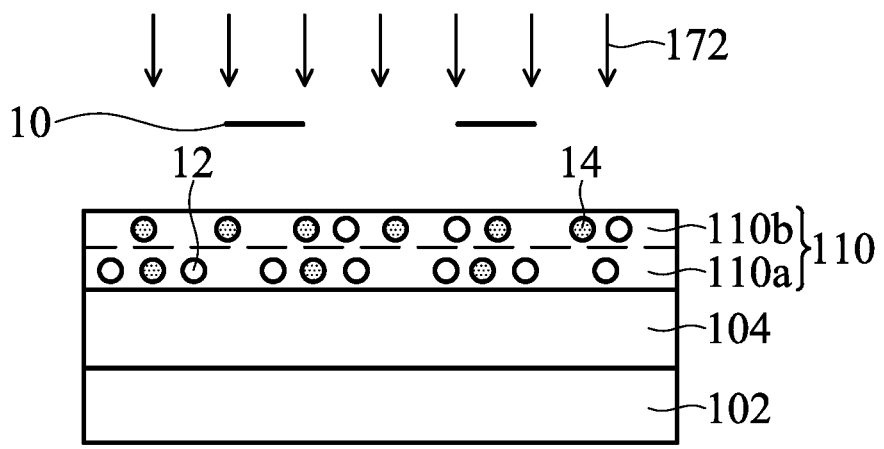

Afterwards, as shown in FIG. 1C, a mask 10 is formed over the resist layer 110, and an exposure process 172 is performed on the resist layer 110 to form an exposed region and an unexposed region, in accordance with some embodiments of the disclosure.

The radiation energy of the exposure process 172 may include a 248 nm beam by Krypton Fluoride (KrF) excimer lasers, a 193 nm beam by Argon Fluoride (ArF) excimer lasers, a 157 nm beam by Fluoride ($F_2$) Excimer Lasers, or Extreme ultra-violet (EUV) light, such as EUV light with wavelength of about 13.5 nm.

The Extreme ultra-violet (EUV) light is widely used in forming small semiconductor devices. However, the resist layer 110 has low EUV photon absorption and the bottom portion of the resist layer 110 cannot easily undergo the deprotection reaction since the bottom portion is farther away from the light source than the top portion is. If the exposed region of the bottom portion of the resist layer 110 is not removed completely, scum may bridge adjacent unexposed regions, and an unwanted problem of bridging may occur. In order to prevent unwanted bridging, the first polymers 12 with a relatively low first activation energy (Ea) are concentrated in the bottom portion 110b of the resist layer 110.

Furthermore, if the exposed region of the top portion of the resist layer 110 has a lower etching resistance, too much of the exposed region of the top portion will be removed, causing problems with unwanted line breakage. In order to prevent line breakage, the second polymers 14 with relatively high second activation energy (Ea) are concentrated in the top portion 110b of the resist layer 110. Therefore, two different polymers are designed in the resist layer 110 to improve the patterns of the resist layer 110.

After the exposure process 172, a post-exposure-baking (PEB) process is performed. The PAG in the resist layer 110 generates acid when the resist layer 110 is exposed to the radiation energy and absorbs the radiation. During the PEB process, the acid labile groups (ALG) are cleaved from the first polymers 12 and the second polymers 14 when the resist layer 110 is in the acidic environment. As a result, the polarity and/or solubility of the exposed region of the resist layer 110 are changed.

In some embodiments, the PEB process includes using a microwave or an IR lamping heating process. In some embodiments, the PEB process is performed at a temperature in a range from about 80 degrees Celsius (t) to about 140 degrees Celsius (t). In some other embodiments, the PEB process is performed for a period of time in a range from about 30 seconds to about 120 seconds. It should be noted that since the microwave or the IR lamping heating process can uniformly provide heat, the resist layer 110 is uniformly baked at a certain temperature in the microwave or the IR lamping heating process. The chemical reaction in the resist layer 110 can react quickly by uniformly providing heat. As a result, the heating time of the baking process may be reduced to less than 120 seconds.

Figure 4A:
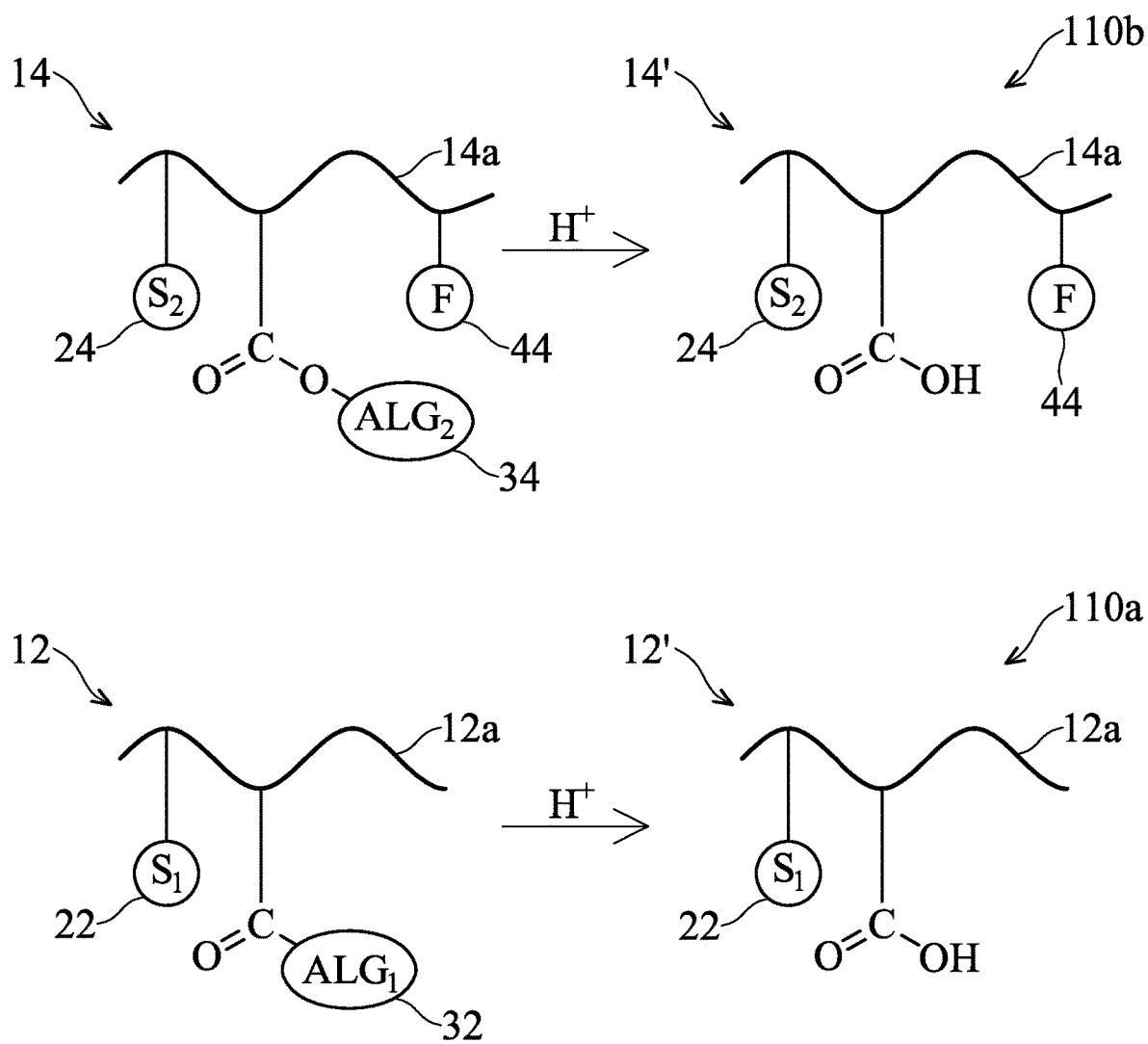
FIG. 4A is a schematic diagram that shows a reaction occurring in the resist layer after the exposure process and the PEB process are performed on the resist layer, in accordance with some embodiments.

FIG. 4A is a schematic diagram that shows a reaction occurring in the resist layer 110 after the exposure process 172 and the PEB process are performed on the resist layer 110, in accordance with some embodiments.

As shown in FIG. 4A, after the PEB process, the $ALG_1$ 32 is released from the first polymer backbone 12a of the first polymer 12, the carboxylic acid (COOH) group is formed in the first polymer 12. In addition, the $ALG_2$ 34 is released from the second polymer backbone 14a of the second polymer 14, and the carboxylic acid group is formed in the second polymer 14.

As mentioned above, most of the first polymers 12 are located at the bottom portion 110a of the resist layer 110, and most of the second polymers 14 are located at the top portion 110b of the resist layer 110. Each of the second polymers 14 has a second acid labile group ($ALG_2$) 34 with a higher activation energy (Ea), and therefore the second polymers 14 in the top portion 110b of the resist layer 110 cannot easily undergo a deprotection reaction. In contrast, each of the first polymers 12 has a first acid labile group ($ALG_1$) 32 having a relatively low activation energy (Ea), and therefore the first polymers 12 in the bottom portion 110b of the resist layer 110 can easily undergo the deprotection reaction. Compared with the first polymer 12, more second acid labile groups ($ALG_2$) 34 of the second polymers 14 are still bonded to the second polymer backbone 14a after the exposure process and the PEB process. More carboxylic acid groups are generated in the first polymers 12. Therefore, the number of carboxylic acid groups in the first polymers 12 is greater than the number of carboxylic acid groups in the second polymers 14. As a result, the bottom portion 110a of the resist layer 110 becomes more hydrophilic since more carboxylic acid groups are bonded to the first polymer backbone 12a.

Figure 1D:
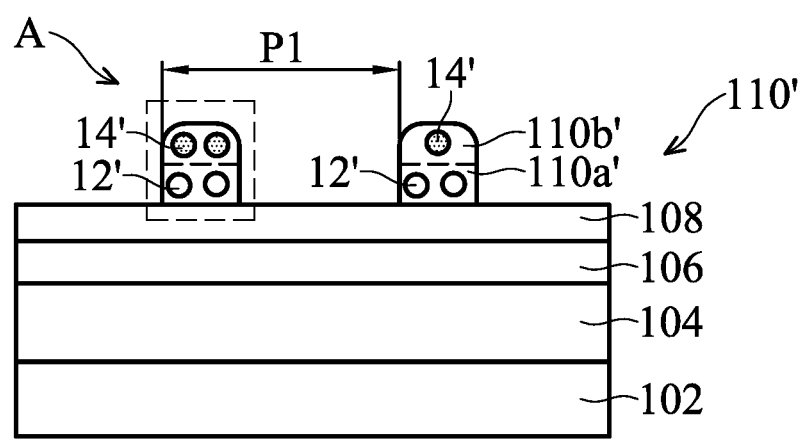

Next, as shown in FIG. 1D, the resist layer 110 is developed by performing a develop process to form a patterned resist layer 110', in accordance with some embodiments of the disclosure. The patterned resist layer 110' includes a patterned top portion 110b' and a patterned bottom portion 110a'. The patterned first polymers 12' are concentrated in the patterned bottom portion 110a', and the patterned second polymers 14' are concentrated in the patterned top portion 110b'.

There are two types of developing processes: a positive tone development (PTD) process and a negative tone development (NTD) process. The PTD process uses a positive tone developer, which generally refers to a developer that selectively dissolves and removes exposed portions of the resist layer. The NTD process uses a negative tone developer, which generally refers to a developer that selectively dissolves and removes unexposed portions of the resist layer. In some embodiments, the PTD developers are aqueous base developers, such as tetramethylammonium hydroxide (TMAH). In some embodiments, the NTD developers are organic-based developers, such as n-butyl acetate (n-BA). As shown in FIG. 1D, in some embodiments, a positive tone developer (PTD) process is performed, the unexposed region of the resist layer 110 remains, and the exposed region of the resist layer 110 is removed by the developer.

The unexposed region of the resist layer 110 has a number of protruding structures. In some embodiments, there is a pitch $P_1$ which is the distance between the right sidewall surface of the first protruding structure and the right sidewall surface of the second protruding structure.

Figure 4B:
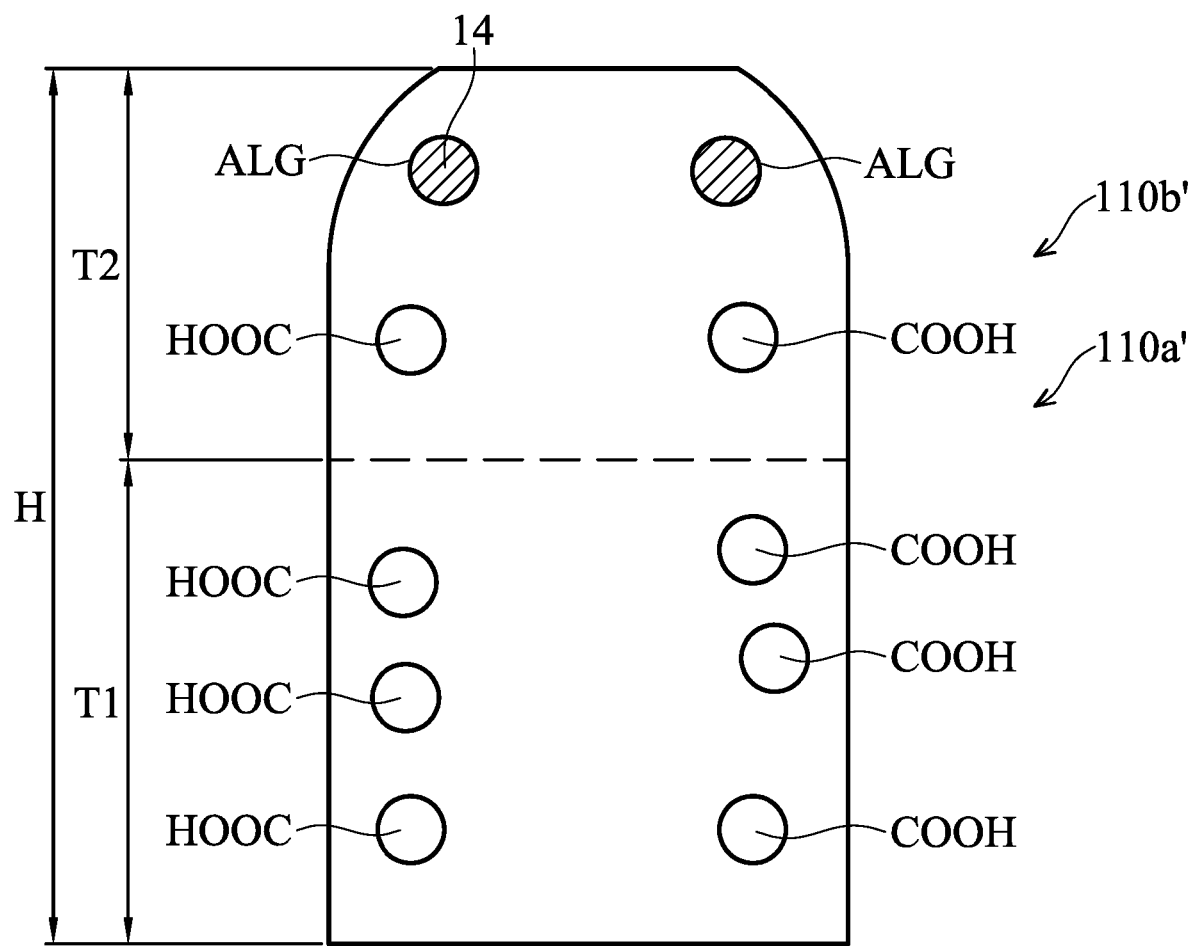
FIG. 4B shows an enlarged cross-sectional representation of region A of FIG. 1D, in accordance with some embodiments.

FIG. 4B shows an enlarged cross-sectional representation of region A of FIG. 1D, in accordance with some embodiments. The region A shows the patterned top portion 110b' and the patterned bottom portion 110a'. More carboxylic acid groups are formed in the patterned bottom portion 110a' due to the first acid labile group ($ALG_1$) 32 with a lower Ea. More second labile groups ($ALG_2$) 34 are remained in the patterned top portion 110b' due to the second labile group ($ALG_2$) 34 with a higher Ea. Therefore, there are more second labile groups ($ALG_2$) 34 in the patterned top portion 110b' to increase the etching resistance.

If the bottom portion 110a is not reduced to a predetermined amount, two adjacent patterns may overlap and cause unwanted bridging. As mentioned above, the higher amount of $ALG_1$ 32 is cleaved from the first polymers 12 due to the $ALG_1$ 32 having a lower Ea, the bottom portion 110a of the resist layer 110 becomes hydrophilic and easy to remove with a base solution, such as tetramethylammonium hydroxide (TMAH). Therefore, the bridging problem may be prevented.

If the top portion 110b of the resist layer 110 has low etching resistance, too much of the top portion of the patterns may be removed, which can cause such problems as line breakage. In order to prevent unwanted line breakage, the second polymers 14 are designed to have a relatively high Ea to give the top portion 110b of the resist layer 110 high etching resistance.

As shown in FIG. 4B, the patterned bottom portion 110a' has a first thickness $T_1$, the patterned top portion 110b' has a second thickness $T_2$. The total thickness H is the sum of the first thickness $T_1$ and the second thickness $T_2$. In some embodiments, a ratio of the second thickness $T_2$ to the height H is in a range from about 5% to about 50%.

Figure 1E:
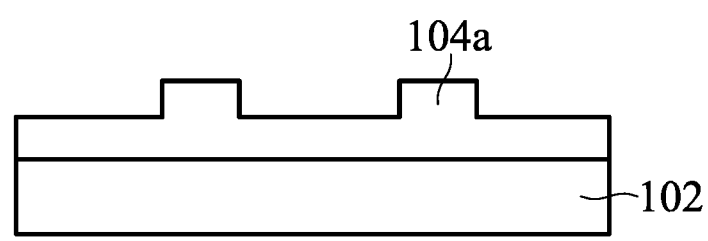

Afterwards, as shown in FIG. 1E, a portion of the material layer 104 is removed by performing an etching process and using the patterned resist layer 110' as a mask, in accordance with some embodiments of the disclosure. As a result, a patterned material layer 104a is formed.

It should be noted that the first polymers 12 and the second polymer 14 are designed to have different chemical structures and different properties. Most of the first polymers 12 diffuse downwardly, and most of the second polymers 14 diffuse upwardly due to the phase separation phenomenon. After the PEB process, some of the ALG are cleaved to form a number of carboxylic groups. Due to the first polymer 12 with the $ALG_1$ 32 having a lower Ea, more $ALG_1$ 32 are deprotected to form more carboxylic acid groups. When more carboxylic acid groups are bonded to the first polymer backbone 12a, the polarity of the first polymers 12 is increased. Therefore, the bottom portion 110a of the resist layer 110 is more hydrophilic than the top portion 110b of the resist layer 110. In other words, the polarity of the patterned bottom portion 110a' is higher than that of the patterned top portion 110b'.

FIGS. 5A-5H show cross-sectional representations of various stages of forming a semiconductor structure, in accordance with some embodiments of the disclosure. Some processes and materials used to form the semiconductor device structure in FIGS. 5A-5H are similar to, or the same as, those used to form the semiconductor device structure FIGS. 1A-1E and are not repeated herein. In FIGS. 5A-5H, a tri-layer photoresist layer 180 is formed over the material layer 104 over the substrate 102. The tri-layer photoresist layer 180 includes a bottom layer 106, a middle layer 108 and a resist layer 110. The tri-layer photoresist layer 180 is used to pattern the underlying material layer and then is removed.

Figure 5A:
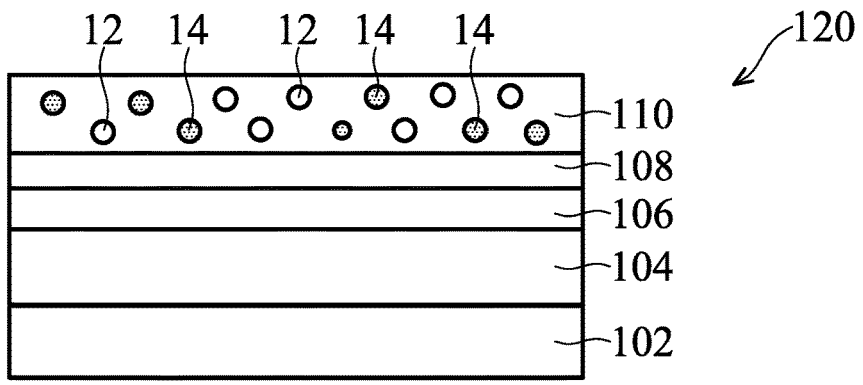
FIGS. 5A-5H show cross-sectional representations of various stages of forming a semiconductor structure, in accordance with some embodiments of the disclosure.

As shown in FIG. 5A, the material layer 104 is formed over the substrate 102. The material layer 104 is configured to be patterned or doped in subsequent manufacturing processes. The material layer 104 may be one or more material layers. In some embodiments, the material layer 104 includes a silicon layer, a dielectric layer, and/or a doped poly-silicon layer.

Afterwards, the bottom layer 106 is formed over the material layer 104. The bottom layer 106 may be a first layer of a tri-layer resist layer 180 (also referred to as tri-layer photoresist). The bottom layer 106 may contain a material that is patternable and/or have anti-reflection properties. In some embodiments, the bottom layer 106 is a bottom anti-reflective coating (BARC) layer. In some embodiments, the bottom layer 106 includes a carbon backbone polymer. In some embodiments, the bottom layer 106 is made of a silicon-free material. In some other embodiments, the bottom layer 106 includes novolac resin, such as a chemical structure having multiple phenol units bonded together. In some embodiments, the bottom layer 106 is formed by a spin-on coating process, a chemical vapor deposition process (CVD), a physical vapor deposition (PVD) process, and/or another suitable deposition process.

Afterwards, a middle layer 108 is formed over the bottom layer 106, and the resist layer 110 is formed over the middle layer 108. In some embodiments, the bottom layer 106, the middle layer 108 and the resist layer (or the top layer) 110 are called a tri-layer photoresist structure. The middle layer 108 may have a composition that provides anti-reflective properties and/or hard mask properties for the photolithography process. In addition, the middle layer 108 is designed to provide etching selectivity from the bottom layer 106 and the resist layer 110. In some embodiments, the middle layer 108 is made of amorphous silicon, silicon carbide, silicon nitride, silicon oxynitride or silicon oxide. In some embodiments, the middle layer 108 includes a silicon-containing inorganic polymer. In some embodiments, the middle layer 108 includes siloxane polymer (e.g. polymer having a backbone O—Si—O—Si—). In some embodiments, the resist layer 110 includes a chemical structure as shown in FIGS. 2A-2C and 3A-3C.

Figure 5B:
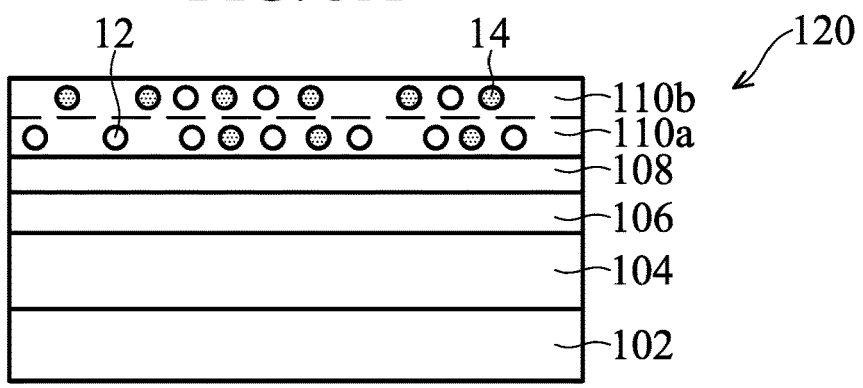

Subsequently, as shown in FIG. 5B, the second polymers 14 and the first polymers 12 diffuse in different directions to form the bottom portion 110a and the top portion 110b, in accordance with some embodiments of the disclosure. The dot line shown in FIG. 5B is drawn to provide a better understanding of the structure, but there is no actual interface or boundary between the bottom portion 110a and the top portion 110b.

Since the first polymers 12 and the second polymers 14 respectively have different properties during the spin-coating process, the second polymers 14 diffuse upwardly and the first polymers 12 diffuse downwardly. This phenomenon is called phase separation. Most of the second polymers 14 are in the top portion 110b, and most of the first polymers 12 are in the bottom portion 110a of the resist layer 110.

The top portion 110b of the resist layer 110 contains a higher concentration of second polymers 14 than the bottom portion 110a of the resist layer 110. The bottom portion 110a of the resist layer 110 contains a higher concentration of first polymers 12 than the top portion 110b of the resist layer 110.

Figure 5C:
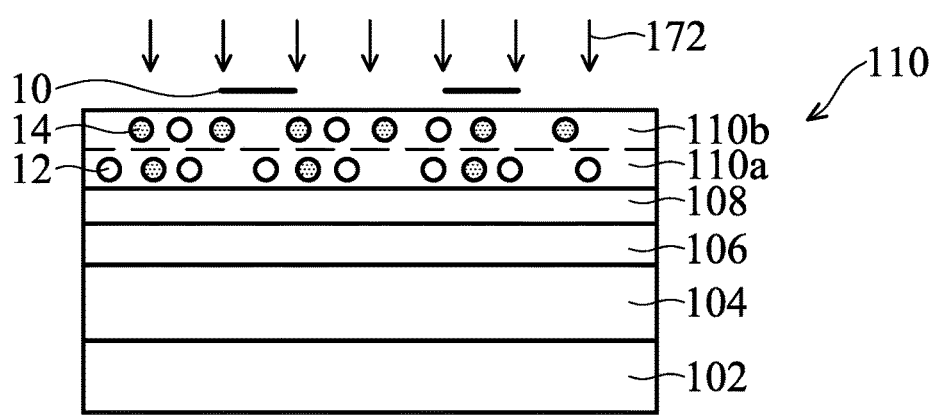

Next, as shown in FIG. 5C, a mask 10 is formed over the resist layer 110, and the exposure process 172 is perform on the resist layer 110, in accordance with some embodiments of the disclosure. After the exposure process 172, the PEB process is performed.

It should be noted that since the resist layer 110 includes the first polymers 12 and the second polymers 14 having structures as shown in FIGS. 2A-3C and 3A-3C, the bottom portion 110b and the top portion 110a respectively have different etching resistance relative to the developer due to their different activation energies. As a result, the bottom portion 110a of the resist layer 110 becomes hydrophilic and is easily removed by the base solution (such as TMAH). Therefore, unwanted bridging may be prevented. Furthermore, the top portion 110b of the resist layer 110 has a high etching resistance, and therefore, not too much of the unexposed region of the top portion 110b of the resist layer 110 is removed, so that line breakage is not a problem.

Figure 5D:
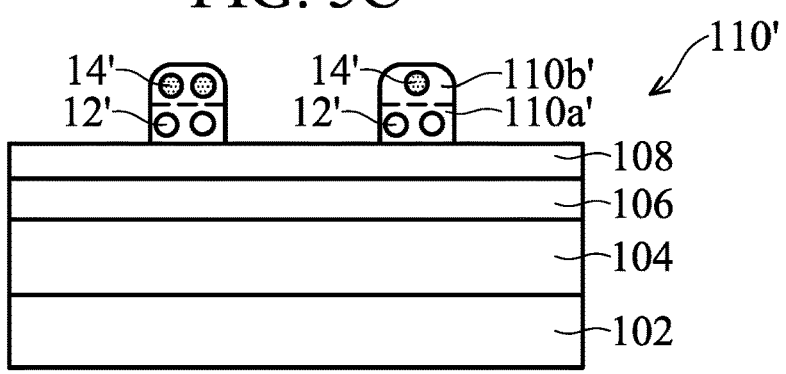

Afterwards, as shown in FIG. 5D, the resist layer 110 is developed by performing a develop process to form a patterned resist layer 110', in accordance with some embodiments of the disclosure. The patterned resist layer 110' includes a patterned top portion 110b' and a patterned bottom portion 110a'.

In some embodiments, the positive tone developer (PTD) process is performed, the unexposed region of the resist layer 110 remains, and the exposed region of the resist layer 110 is removed by the developer. In some embodiments, the PTD developers are aqueous base developers, such as tetramethylammonium hydroxide (TMAH).

Figure 5E:
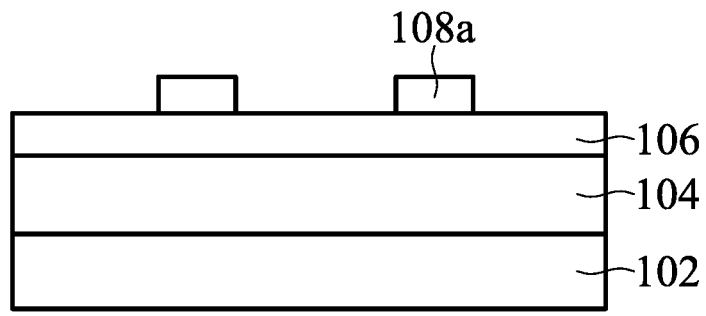

Next, as shown in FIG. 5E, a portion of the middle layer 108 is removed by using the patterned resist layer 110' as a mask to form a patterned middle layer 108a, in accordance with some embodiments of the disclosure. As a result, the pattern of the patterned resist layer 110' is transferred to the middle layer 108.

The portion of the middle layer 108 is removed by a dry etching process, a wet etching process or a combination thereof. In some embodiments, the etching process includes a plasma etching process using an etchant having fluorine, such as CF, $CF_2$, $CF_3$, $CF_4$, $C_2F_2$, $C_2F_3$, $C_3F_4$, $C_4F_4$, $C_4F_6$, $C_5F_6$, $C_6F_6$, $C_6F_8$, or a combination thereof.

Afterwards, the patterned resist layer 110' is removed, in accordance with some embodiments of the disclosure. In some embodiments, the patterned resist layer 110' is removed by a wet etching process or a dry etching process.

Figure 5F:
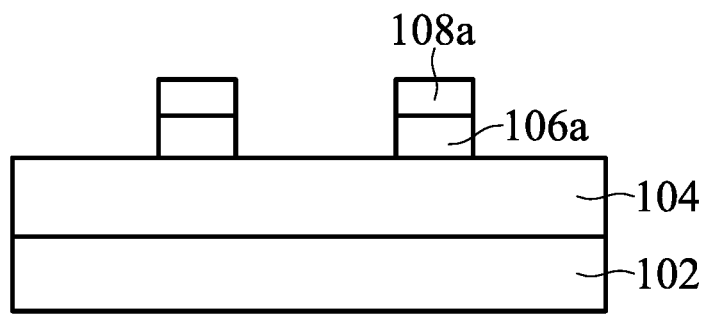

Next, as shown in FIG. 5F, a portion of the bottom layer 106 is removed by using the patterned middle layer 108a as a mask to form a patterned bottom layer 106a, in accordance with some embodiments of the disclosure. As a result, the pattern of the patterned middle layer 108a is transferred to the bottom layer 106.

Figure 5G:
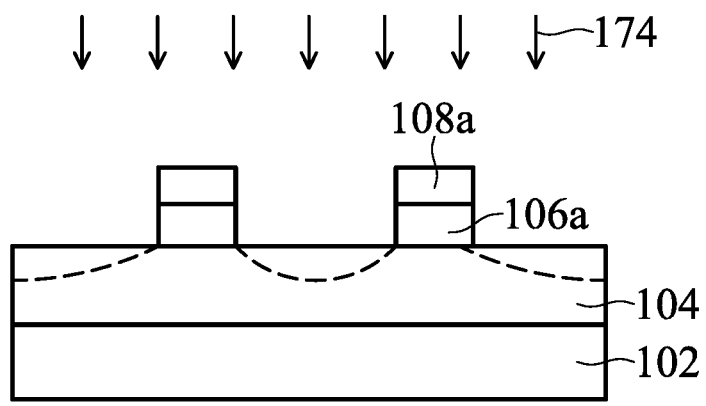

Afterwards, as shown in FIG. 5G, a portion of the material layer 104 is doped by performing an ion implantation process 174 and using the patterned resist layer 110a as a mask, in accordance with some embodiments of the disclosure. Afterwards, the patterned middle layer 108a and the patterned middle layer 106a are removed.

Figure 5H:
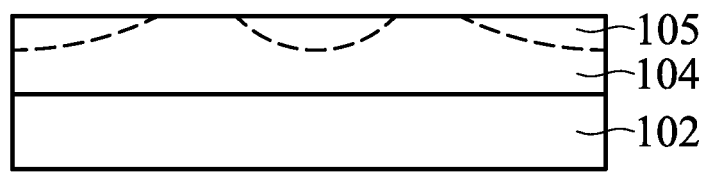

As a result, as shown in FIG. 5H, a doped region 105 is formed in the material layer 104. The doped region 105 may be doped with p-type dopants, such as boron or $BF_2$, and/or n-type dopants, such as phosphorus (P) or arsenic (As).

Embodiments for forming a semiconductor device structure are provided. A material layer is formed over a substrate, and a resist layer is formed over the material layer. The resist layer is patterned by performing an exposure process, a baking process and an etching process. A resist solution includes a number of first polymers and a number of second polymers. Each of the first polymers includes a first polymer backbone, and a first acid-labile group (ALG) with a first activation energy bonded to the first polymer backbone. Each of the second polymers includes a second polymer backbone, and a second acid-labile group with a second activation energy bonded to the second polymer backbone, the second activation energy is greater than the first activation energy. Each of the second polymers further includes a floating group to float the second polymer. As a result, the first polymer is concentrated in the bottom portion of the resist layer, and the second polymer is concentrated in the top portion of the resist layer. The design of the first polymer and the second polymer give the top portion of the resist layer a high etching resistance, and not too much of the top portion is removed. Furthermore, the bottom portion of the resist layer becomes hydrophilic and can easily be removed by the developer. The problems of bridging and line breakage are prevented. The resolution and/or the dimensional control of the patterns of the resist layer are improved. Therefore, the performance of forming the semiconductor device structure is improved.

In some embodiments, a method for forming a semiconductor structure is provided. The method includes forming a material layer over a substrate and providing a resist solution. The resist solution includes a plurality of first polymers and a plurality of second polymers, each of the first polymers includes a first polymer backbone, and a first acid-labile group (ALG) with a first activation energy bonded to the first polymer backbone. Each of the second polymers includes a second polymer backbone, and a second acid-labile group with a second activation energy bonded to the second polymer backbone, the second activation energy is greater than the first activation energy. The method includes forming a resist layer over the material layer, and the resist layer includes a top portion and a bottom portion, the first polymers diffuse to the bottom portion, and the second polymers diffuse to the top portion. The method also includes exposing a portion of the resist layer by performing an exposure process and removing a portion of the resist layer to form a patterned resist layer. The method further includes patterning the material layer by using the patterned resist layer as a mask and removing the patterned resist layer.

In some embodiments, a method for forming a semiconductor structure is provided. The method includes forming a material layer over a substrate and forming a resist layer over the substrate. The resist layer includes a bottom portion and a top portion, the top portion of the resist layer includes a plurality of first polymers, the bottom portion of the resist layer includes a plurality of second polymers. Each of the first polymers includes a first acid-labile group (ALG) with a first activation energy. Each of the second polymers includes a second acid-labile group with a second activation energy that is greater than the first activation energy and a floating group. The method also includes patterning the resist layer to form a patterned resist layer.

In some embodiments, a method for forming a semiconductor structure is provided. The method includes forming a material layer over a substrate and forming a bottom layer over the material layer. The method also includes forming a middle layer over the bottom layer and forming a resist layer over the middle layer. The resist layer includes a plurality of first polymers and a plurality of second polymers. Each of the first polymers includes a plurality of first acid-labile groups (ALG) with a first activation energy, each of the second polymers includes a plurality of second acid-labile groups with a second activation energy that is greater than the first activation energy. The method also includes exposing a portion of the resist layer to form an exposed region and an unexposed region by performing an exposure process. The method further includes performing a post-exposure-baking (PEB) process on the resist layer, and a portion of the first acid-labile groups cleaves from the first polymers to form first polymers with a plurality of carboxylic acid groups. A portion of the second acid-labile groups cleaves from the second polymers to form second polymers with a plurality of carboxylic acid groups after the PEB process, and the number of the carboxylic acid groups in the first polymers is greater than the number of the carboxylic acid groups in the second polymers. The method also includes etching a portion of the resist layer to form a patterned resist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a material layer over a substrate;
    forming a middle layer over the material layer;
    forming a resist layer over the middle layer by using a resist solution, wherein the resist solution comprises a plurality of first polymers and a plurality of second polymers, each of the first polymers comprises a first polymer backbone and a first acid-labile group (ALG) with a first activation energy bonded to the first polymer backbone, each of the second polymers comprises a second polymer backbone and a second acid-labile group with a second activation energy bonded to the second polymer backbone, wherein the second activation energy is greater than the first activation energy, wherein the resist layer comprises a top portion and a bottom portion, the first polymers diffuse to the bottom portion, and the second polymers diffuse to the top portion, wherein the second polymers diffuse to a top surface of the resist layer away from an interface between the resist layer and the middle layer;

exposing a portion of the resist layer by performing an exposure process;

removing a portion of the resist layer to form a patterned resist layer;

patterning the material layer by using the patterned resist layer as a mask; and removing the patterned resist layer.

2. The method for forming the semiconductor structure as claimed in claim 1, wherein forming the resist layer over the material layer is by performing a spin-coating process, and the first polymers and the second polymers diffuse in different directions.

3. The method for forming the semiconductor structure as claimed in claim 1, wherein the first polymers are distributed in the bottom portion at a first concentration and in the top portion at a second concentration, and the first concentration is higher than the second concentration.

4. The method for forming the semiconductor structure as claimed in claim 1, wherein the second polymers are distributed in the bottom portion at a third concentration and in the top portion at a fourth concentration, and the third concentration is lower than the fourth concentration.

5. The method for forming the semiconductor structure as claimed in claim 1, wherein each of the second polymers further comprises a floating group bonded to the second polymer backbone and the floating group comprises carbon fluoride ($C_xF_y$).

6. The method for forming the semiconductor structure as claimed in claim 1, wherein each of the second polymers further comprises a floating group bonded to the second acid-labile group.

7. The method for forming the semiconductor structure as claimed in claim 1, wherein the patterned resist layer comprises a patterned top portion and a patterned bottom portion, wherein a polarity of the patterned top portion is higher than a polarity of the patterned bottom portion.

8. The method for forming the semiconductor structure as claimed in claim 1, wherein each of the first polymers has a first average molecular weight, and each of the second polymers has a second average molecular weight that is greater than the first average molecular weight.

9. The method for forming the semiconductor structure as claimed in claim 1, wherein removing the portion of the resist layer is by using a base solution, and the base solution is tetramethylammonium hydroxide (TMAH).

10. The method for forming the semiconductor structure as claimed in claim 1, further comprising:
performing a baking process on the resist layer after performing the exposure process, wherein the first acid-labile group (ALG) cleaves from the first polymer backbone, and the second acid-labile group (ALG) cleaves from the second polymer backbone.

11. A method for forming a semiconductor structure, comprising:
forming a material layer over a substrate;
forming a middle layer over the material layer;
forming a resist layer over the middle layer, wherein the resist layer comprises a bottom portion and a top portion, the top portion of the resist layer comprises a plurality of first polymers, the bottom portion of the resist layer comprises a plurality of second polymers, each of the first polymers comprises a first acid-labile group (ALG) with a first activation energy, and each of the second polymers comprises a second acid-labile group with a second activation energy that is greater than the first activation energy, and a floating group, and the first polymers diffuse to a bottom surface of the resist layer, and the second polymers diffuse to a top surface of the resist layer away from an interface between the resist layer and the middle layer; and patterning the resist layer to form a patterned resist layer.

12. The method for forming the semiconductor structure as claimed in claim 11, wherein each of the first polymers has a first average molecular weight, each of the second polymers has a second average molecular weight that is greater than the first average molecular weight.

13. The method for forming the semiconductor structure as claimed in claim 11, wherein patterning the resist layer comprises:
exposing a portion of the resist layer to form an exposed region and an unexposed region by performing an exposure process; and
performing a post-exposure-baking (PEB) process on the resist layer, wherein the first acid-labile group (ALG) and the second ALG cleave from the first polymer and the second polymer respectively when performing the PEB process on the resist layer.

14. The method for forming the semiconductor structure as claimed in claim 13, wherein a polarity of the top portion of the patterned resist layer is lower than a polarity of the bottom portion of the patterned resist layer after the PEB process.

15. The method for forming the semiconductor structure as claimed in claim 13, wherein a portion of the first acid-labile groups cleaves from the first polymers to form first polymers with a plurality of carboxylic acid groups, and a portion of the second acid-labile groups cleaves from the second polymers to form second polymers with a plurality of carboxylic acid groups after the PEB process, the number of the carboxylic acid groups in the first polymers is higher than the number of the carboxylic acid groups in the second polymers.

16. The method for forming the semiconductor structure as claimed in claim 11, wherein the floating group is bonded to a second polymer backbone or the second acid-labile group.

17. A method for forming a semiconductor structure, comprising:
forming a material layer over a substrate;
forming a bottom layer over the material layer;
forming a middle layer over the bottom layer;
forming a resist layer over the middle layer, wherein the resist layer comprises a plurality of first polymers and a plurality of second polymers, each of the first polymers comprises a plurality of first acid-labile groups (ALG) with a first activation energy, and each of the second polymers comprises a plurality of second acid-labile groups with a second activation energy that is greater than the first activation energy, wherein first polymers diffuse downwardly, and the second polymers diffuse upwardly, wherein the second polymers diffuse to a top surface of the resist layer away from an interface between the resist layer and the middle layer;
exposing a portion of the resist layer to form an exposed region and an unexposed region by performing an exposure process;
performing a post-exposure-baking (PEB) process on the resist layer, wherein a portion of the first acid-labile groups cleaves from the first polymers to form first polymers with a plurality of carboxylic acid groups, a portion of the second acid-labile groups cleaves from the second polymers to form second polymers with a plurality of carboxylic acid groups after the PEB process, and the number of carboxylic acid groups in the first polymers is greater than the number of carboxylic acid groups in the second polymers; and etching a portion of the resist layer to form a patterned resist layer.

18. The method for forming the semiconductor structure as claimed in claim 17, wherein each of the second polymers further comprises a second polymer backbone, a floating group bonded to the second polymer backbone, and the floating group comprises carbon fluoride (CxFy).

19. The method for forming the semiconductor device structure as claimed in claim 17, further comprising:

removing a portion of the middle layer by using the patterned resist layer as a mask to form a patterned middle layer;

removing a portion of the bottom layer by using the patterned middle layer as a mask to form a patterned bottom layer; and performing an etching process or an ion implantation process on the material layer by using the patterned bottom layer as a mask.

20. The method for forming the semiconductor device structure as claimed in claim 17, wherein each of the first polymers has a first average molecular weight, and each of the second polymers has a second average molecular weight that is greater than the first average molecular weight.

* * * * *